(12) United States Patent
Chang et al.

(10) Patent No.: US 11,350,532 B1
(45) Date of Patent: May 31, 2022

(54) PORTABLE DATA STORAGE DEVICE WITH DOUBLE ROTATABLE PROTECTIVE SWIVELS

(71) Applicant: VINPOWER INC., Alhambra, CA (US)

(72) Inventors: Calvinson Chang, Alhambra, CA (US); Stanley Chu, Alhambra, CA (US); Chihhan Chou, Alhambra, CA (US)

(73) Assignee: Vinpower Inc., Alhambra, CA (US)

( * ) Notice: Subject to any disclaimer, the term of this patent is extended or adjusted under 35 U.S.C. 154(b) by 0 days.

(21) Appl. No.: 17/226,544

(22) Filed: Apr. 9, 2021

(51) Int. Cl.
*H05K 5/00* (2006.01)
*H05K 5/03* (2006.01)

(52) U.S. Cl.
CPC .......... *H05K 5/0052* (2013.01); *H05K 5/006* (2013.01); *H05K 5/0086* (2013.01); *H05K 5/03* (2013.01)

(58) Field of Classification Search
CPC ..... H05K 5/0052; H05K 5/006; H05K 5/0086
See application file for complete search history.

(56) References Cited

U.S. PATENT DOCUMENTS

| | | | |
|---|---|---|---|
| 8,241,047 B2* | 8/2012 | Ni | G11C 11/5621 439/131 |
| 9,202,089 B2* | 12/2015 | Yang | H01R 13/447 |
| 9,215,820 B2* | 12/2015 | Villa-Real | H05K 5/0278 |
| 9,459,659 B2* | 10/2016 | Chang | G06F 1/1656 |
| 9,519,316 B2* | 12/2016 | Huang | G06F 1/181 |
| 2006/0028803 A1* | 2/2006 | Pocrass | G06K 19/07732 361/737 |
| 2006/0083158 A1* | 4/2006 | Lee | H01R 31/065 370/208 |
| 2009/0089496 A1* | 4/2009 | Huang | G06K 19/07732 711/111 |
| 2011/0237099 A1* | 9/2011 | Ni | H05K 5/0278 439/142 |
| 2013/0027868 A1* | 1/2013 | Villa-Real | H01R 13/447 361/679.31 |

* cited by examiner

*Primary Examiner* — Abhishek M Rathod
*Assistant Examiner* — Keith DePew
(74) *Attorney, Agent, or Firm* — Rosenberg, Klein & Lee

(57) ABSTRACT

A portable data storage device that has a main housing, a data storage module mounted in the main housing, a first protective swivel, and a second protective swivel. The data storage module has a first electrical connector and a second electrical connector. The first protective swivel is U-shaped and has two ends pivotally connected to the main housing. The second protective swivel is U-shaped and has two ends pivotally connected to the first protective swivel. The first protective swivel and the second protective swivel are not removed from the main housing before using the portable data storage device, thus preventing from being loss. The first protective swivel and the second protective swivel cover the first electrical connector and the second electrical connector respectively and protect the first electrical connector and the second electrical connector from being damaged.

8 Claims, 5 Drawing Sheets

PORTABLE DATA STORAGE DEVICE WITH DOUBLE ROTATABLE PROTECTIVE SWIVELS

BACKGROUND OF THE INVENTION

1. Field of the Invention

The present invention relates to a portable data storage device, especially to a portable data storage device that covers every electrical connector with a rotatable protective swivel.

2. Description of the Prior Art(s)

A rewritable portable data storage device, such as a Universal Serial Bus (USB) flash drive, is small in size, light in weight, and easy to carry. It is commonly used to store digital data and transfer said digital data from one computer to another.

A conventional portable data storage device includes a hollow housing and a data storage module mounted in the housing. The data storage module has an electrical connector protruding out of the housing. In order to protect the electrical connector and pins inside the electrical connector from being damaged, the electrical connector may be covered with a protective cap. The protective cap is removed to reveal the electrical connector before the electrical connector can be inserted into a corresponding electrical connector on a computer to transfer data.

With the new standards of data transmission interface and new types of the electrical connectors being introduced, the need for adding these new electrical connectors to the conventional portable data storage device increases. With more than one electrical connector, a conventional portable data storage device could be connected to the electronics devices with different kinds of electrical connectors and transfer data with the connected electronics devices. For instance, a conventional portable data storage device may have a USB connector to connect to a computer and a Lightning connector that is introduced by Apple Inc. to connect to an Apple mobile device.

In order to use the conventional portable data storage device with protective caps, a user has to remove the protective cap before using it and put the protective cap back onto the housing after using it. If the protective cap is not properly stored when being removed and gets lost, it would increase the chance of damaging the electrical connector.

The present invention provides a method of double rotatable protective swivels on a portable data storage device to protect the electrical connectors and mitigate or obviate the aforementioned problems.

SUMMARY OF THE INVENTION

The main objective of the present invention is to provide a portable data storage device that has a main housing, a data storage module, a first protective swivel, and a second protective swivel. The data storage module is mounted in the main housing and has a first electrical connector and a second electrical connector. The first protective swivel is U-shaped and has two ends pivotally connected to the main housing. The second protective swivel is U-shaped and has two ends pivotally connected to the first protective swivel. The first protective swivel and the second protective swivel are not removed from the main housing before using the portable data storage device, thus preventing from being loss. The first protective swivel and the second protective swivel cover the first electrical connector and the second electrical connector respectively and protect the first electrical connector and the second electrical connector from being damaged.

DETAILED DESCRIPTION OF THE PREFERRED EMBODIMENTS

Figure 1:
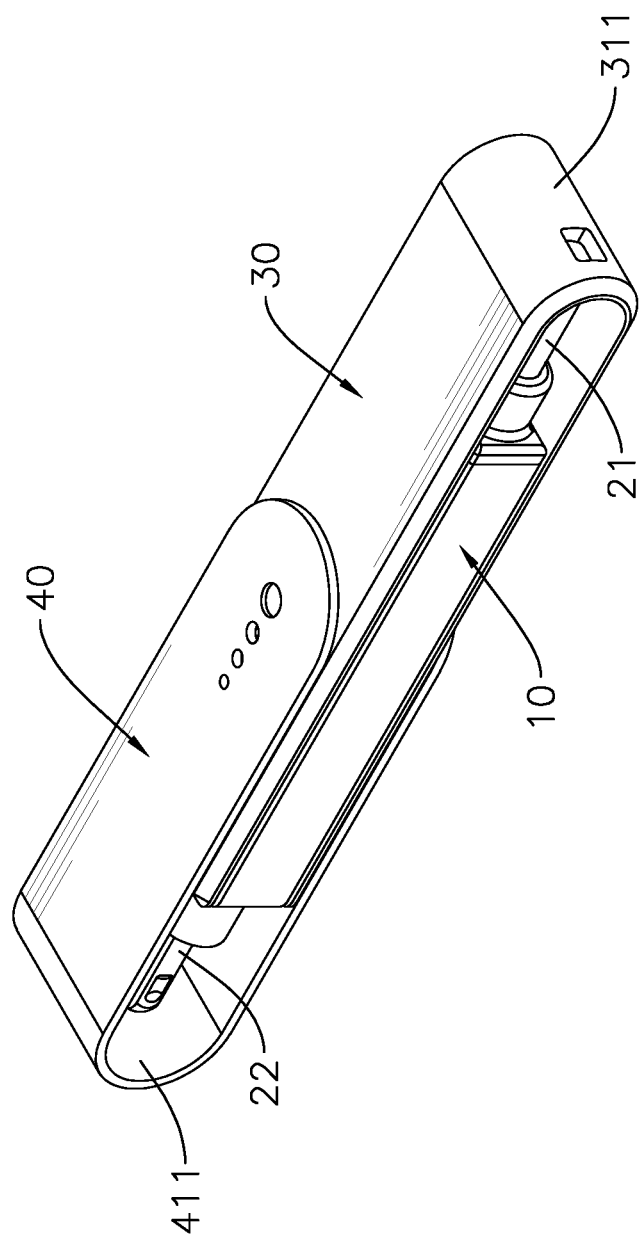
FIG. 1 is perspective view of a portable data storage device in accordance with the present invention.
Figure 2:
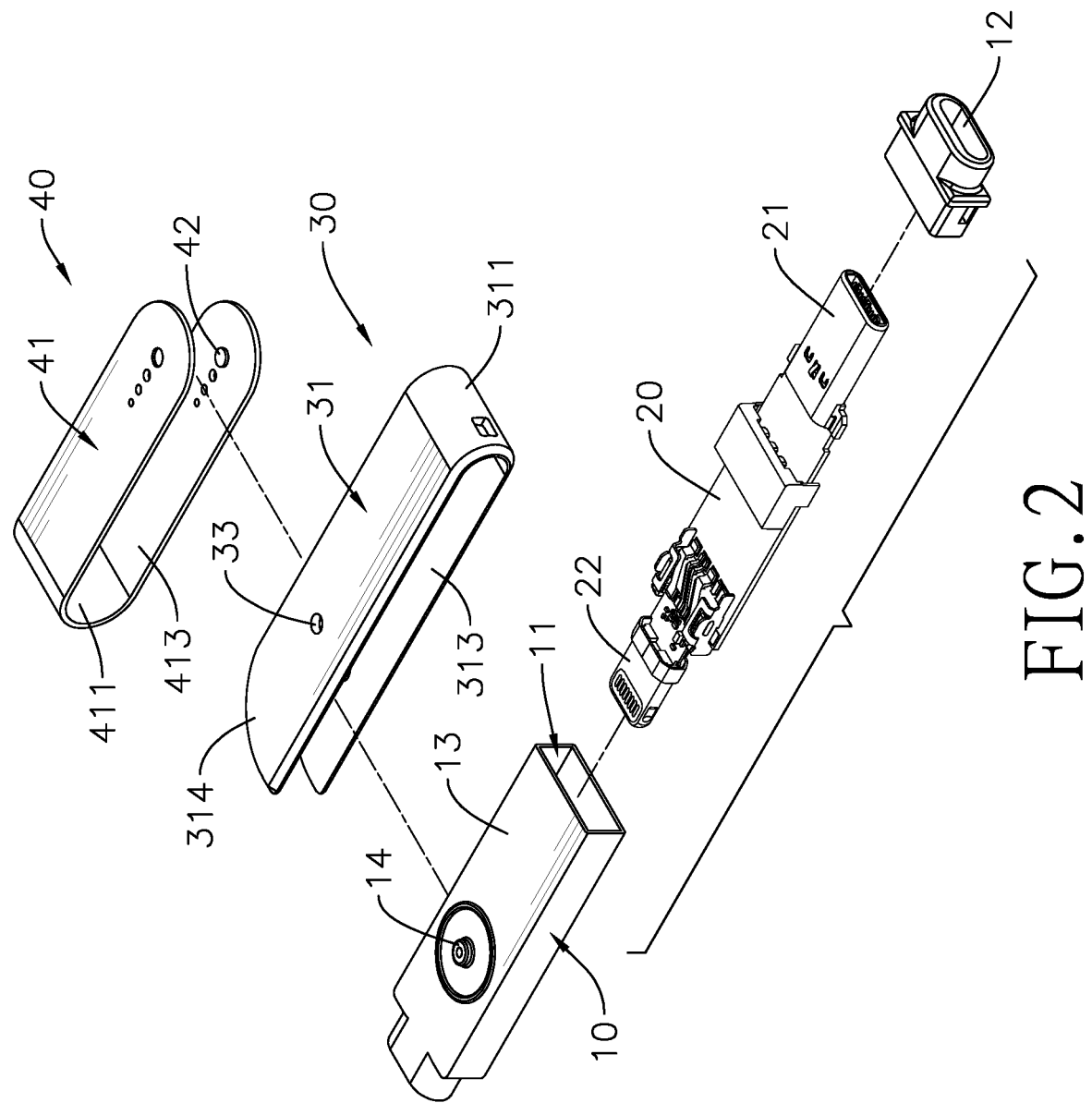
FIG. 2 is an exploded perspective view of the portable data storage device in FIG. 1.

With reference to FIGS. 1 and 2, a portable data storage device in accordance with the present invention comprises a main housing 10, a data storage module 20, a first protective swivel 30, and a second protective swivel 40.

Figure 3:
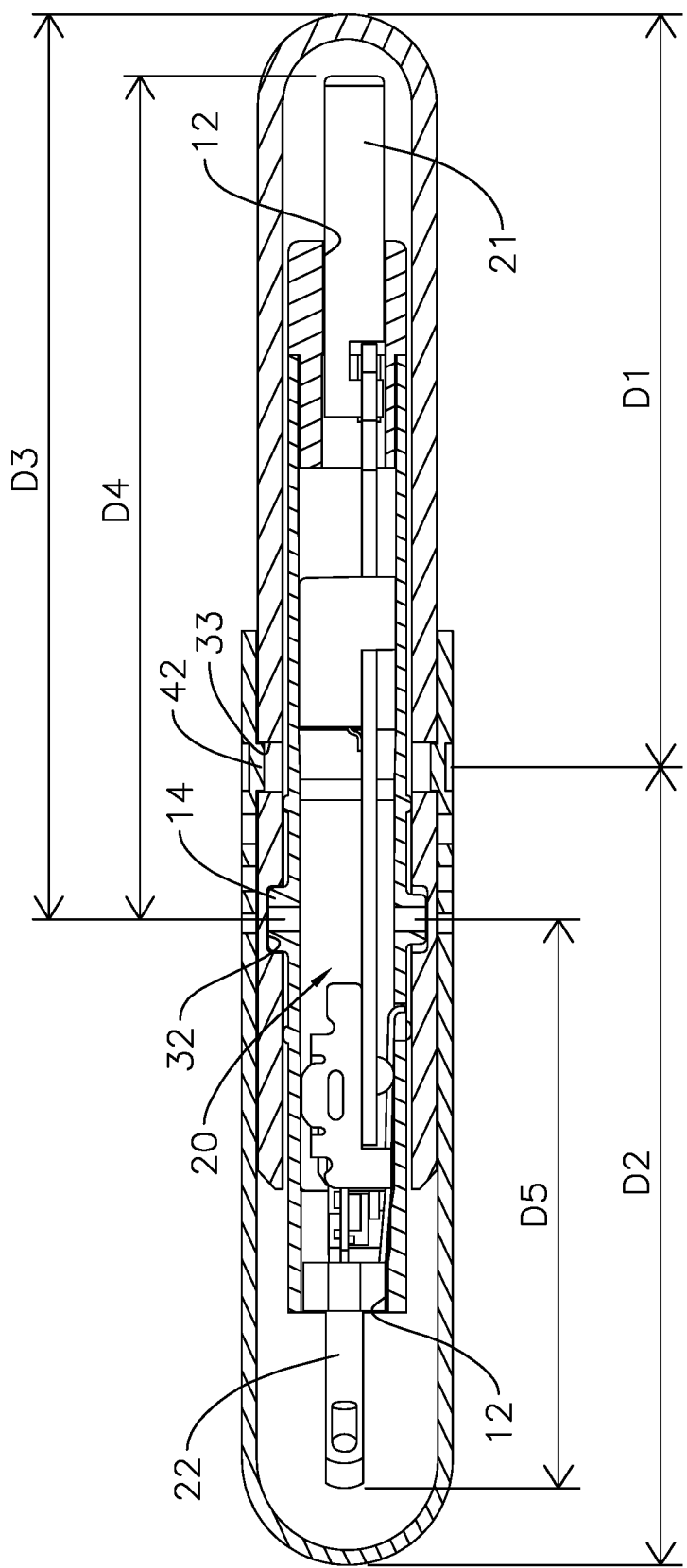
FIG. 3 is a cross-sectional side view of the portable data storage device in FIG. 1.

With further reference to FIG. 3, the main housing 10 is hollow and has a receiving chamber 11, two end holes 12, two outer side surfaces 13 and two pivoting parts 14. The receiving chamber 11 is defined inside the main housing 10. The two end holes 12 are formed through two opposite ends of the main housing 10 and communicate with the receiving chamber 11. The two outer side surfaces 13 are oppositely defined on the main housing 10. Each of the outer side surfaces extends between the two end holes 12. The two pivoting parts 14 of the main housing 10 are formed on the outer side surfaces 13 of the main housing 10 respectively and are both located along a first axial line. The data storage module 20 is mounted in the receiving chamber 11 of the main housing 10 and has a first electrical connector 21 and a second electrical connector 22. The first electrical connector 21 and the second electrical connector 22 protrude out of the main housing 10 through the two end holes 12 respectively. In the preferred embodiment as shown in the figures, the first electrical connector 21 is, but is not limited to, a Universal Serial Bus (USB) Type-C connector and the second electrical connector 22 is, but is not limited to, a Lightning connector. In other embodiments, each of the first and second electrical connectors 21, 22 may be an electrical connector, such as a USB Type-A connector, a USB Type-C connector, a Lightning connector or the like, that is for transferring data, and the first electrical connector 21 and the second electrical connector 22 are different kinds of electrical connectors. The first protective swivel 30 is substantially U-shaped, and has two inner panels 31, two inner pivot parts 32 and two outer pivot parts 33. Each of the inner panels 31 is elongated, and has a first end, a second end, an inner surface 313, and an outer surface 314. The first end of the inner panel 31 and the second end of the inner panel 31 are oppositely defined on the inner panel 31. The first ends of the inner panels 31 are connected to each other to form a closed end 311 of the first protective swivel 30. The second ends of the inner panels 31 are spaced at an interval such that an opening end of the first protective swivel 30 is formed. The inner surfaces 313 of the two inner panels 31 of the first protective swivel 30 face each other.

The two inner pivot parts 32 are formed on the inner surfaces 313 of the two inner panels 31 respectively and are pivotally connected with the two pivot parts 14 of the main housing 10 respectively. Thus, the first protective swivel 30 is able to pivot relative to the main housing 10 on the pivot parts 14 of the main housing 10, so as to selectively cover the first electrical connector 21 with the closed end 311 of the first protective swivel 30. When the first electrical connector 21 is covered by the first protective swivel 30, the first electrical connector 21 is received in the first protective swivel 30. When the closed end 311 of the first protective swivel 30 pivots away from the first electrical connector 21, the first electrical connector 21 is revealed and is able to be inserted into a corresponding electrical connector on a computer. The two outer pivot parts 33 are formed on the outer surfaces 314 of the two inner panels 31 respectively and are both located along a second axial line.

The second protective swivel 40 is also substantially U-shaped, and has two outer panels 41 and two pivot parts 42. Each of the outer panels 41 is elongated, and has a first end, a second end and an inner surface 413. The first end of the outer panel 41 and the second end of the outer panel 41 are oppositely defined on the outer panel 41. The first ends of the outer panels 41 are connected to each other to form a closed end 411 of the second protective swivel 40. The second ends of the outer panels 41 are spaced at an interval such that an opening end of the second protective swivel 40 is formed. The inner surfaces 413 of the two outer panels 41 of the second protective swivel 40 face each other. The two pivot parts 42 of the second protective swivel 40 are formed on the inner surfaces 413 of the two outer panels 41 respectively and are pivotally connected with the two outer pivot parts 33 of the first protective swivel 30 respectively.

Thus, the first protective swivel 30 and the second protective swivel 40 are able to pivot relative to each other on the outer pivot parts 33 of the first protective swivel 30, so as to selectively cover the second electrical connector 22 with the closed end 411 of the second protective swivel 40. When the second electrical connector 22 is covered by the second protective swivel 40, the second electrical connector 22 is received in the second protective swivel 40. When the closed end 411 of the second protective swivel 40 pivots away from the second electrical connector 22, the second electrical connector 22 is revealed and is able to be inserted into a corresponding electrical connector on the computer.

Figure 4:
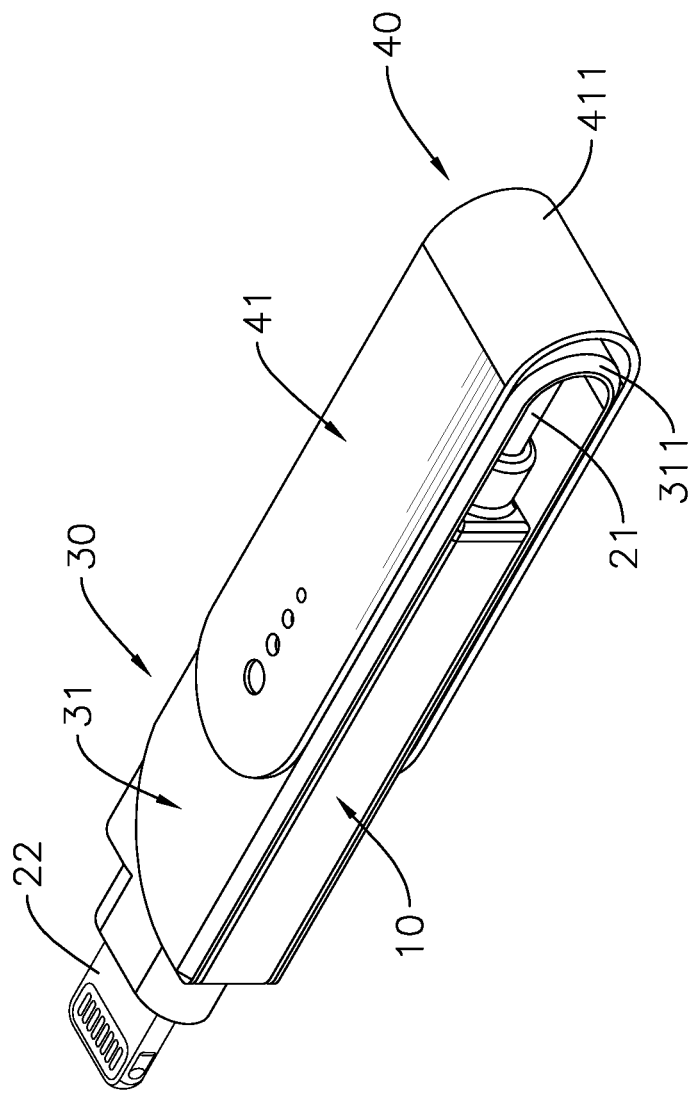
FIG. 4 is an operational perspective view of the portable data storage device in FIG. 1, showing a first protective swivel and a second protective overlapping and covering a first electrical connector.

With further reference to FIGS. 3 and 4, a first distance D1 defined between each of the outer pivot parts 33 of the first protective swivel 30 and the closed end 311 of the first protective swivel 30 is smaller than a second distance D2 defined between each of the pivot parts 42 of the second protective swivel 40 and the closed end 411 of the second protective swivel 40, such that the first protective swivel 30 and the second protective swivel 40 can be rotated to become overlap without interfering with each other. Accordingly, the second protective swivel 40 covers the first protective swivel 30.

Figure 5:
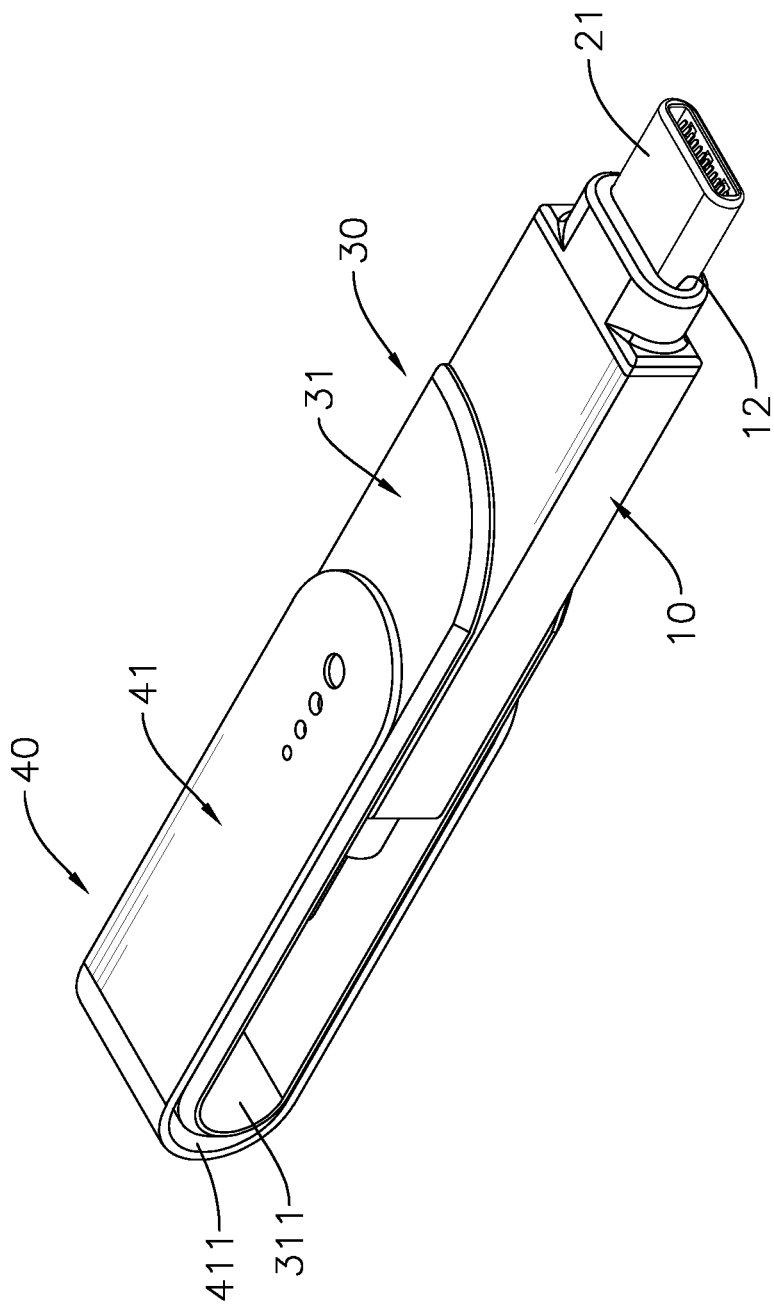
FIG. 5 is another operational perspective view of the portable data storage device in FIG. 1, showing the first protective swivel and the second protective overlapping and covering a second electrical connector.

Furthermore, a third distance defined between each of the inner pivot parts 32 of the first protective swivel 30 and the closed end 311 of the first protective swivel 30 is greater than a fourth distance defined between each of the pivot parts 14 of the main housing 10 and an end surface of the first electrical connector 21 and is also greater than a fifth distance defined between each of the pivot parts 14 of the main housing 10 and an end surface of the second electrical connector 22. Thus, the first protective swivel 30 and the second protective swivel 40 can be rotated to become overlap and cover the first electrical connector 21 at the same time as shown in FIG. 4, or cover the second electrical connector 22 at the same time as shown in FIG. 5.

As shown in FIG. 2, in the preferred embodiment, the first axial line passing through the two pivot parts 14 of the main housing 10 does not coincide with the second axial line passing through the two outer pivot parts 33 of the first protective swivel 30. Therefore, as the first protective swivel 30 rotates, the second protective swivel 40 shifts accordingly, such that variety and fun of using the portable data storage device can be increased. However, it is not limited to that the first axial line does not coincide with the second axial line. The first axial line and the second axial line may also coincide with each other.

The portable data storage device with the two rotatable protective swivels 30, 40 has the following advantages. The first protective swivel 30 and the second protective swivel 40 are not removed from the main housing 10 before using the portable data storage device, thus preventing from being loss. It can be ensured that the first protective swivel 30 and the second protective swivel 40 are rotated to cover the first electrical connector 21 and the second electrical connector 22 respectively and protect the first electrical connector 21 and the second electrical connector 22 from being damaged and deformed due to collision.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A portable data storage device comprising:
    a main housing having two end holes formed through two opposite ends of the main housing;
    two outer side surfaces oppositely defined on the main housing; and
    two pivoting parts formed on the outer side surfaces of the main housing respectively and both located along a first axial line;
    a data storage module mounted in the main housing and having a first electrical connector and a second electrical connector, and the first electrical connector and the second electrical connector protruding out of the main housing through the two end holes respectively;
    a first protective swivel being U-shaped and having two inner panels, and each of the inner panels having a first end, and the first ends of the two inner panels connected to each other to form a closed end of the first protective swivel;
    a second end, and the second ends of the inner panels spaced at an interval such that an opening end of the first protective swivel is formed;
    an inner surface; and
    an outer surface;
    two inner pivot parts formed on the inner surfaces of the two inner panels respectively and pivotally connected with the two pivot parts of the main housing respectively; and
    two outer pivot parts formed on the outer surfaces of the two inner panels respectively and both located along a second axial line, wherein the first axial line passing through the two pivot parts of the main housing does not coincide with the second axial line passing through the two outer pivot parts of the first protective swivel; and a second protective swivel being U-shaped, and having two outer panels, and each of the outer panels having a first end, and the first ends of the outer panels connected to each other to form a closed end of the second protective swivel;

a second end, and the second ends of the outer panels spaced at an interval such that an opening end of the second protective swivel is formed; and an inner surface; and two pivot parts formed on the inner surfaces of the two outer panels respectively and pivotally connected with the two outer pivot parts of the first protective swivel respectively; and wherein the second protective swivel is driven to move laterally due to the rotation of the first protective swivel.

2. The portable data storage device as claimed in claim 1, wherein a first distance defined between each of the outer pivot parts of the first protective swivel and the closed end of the first protective swivel is smaller than a second distance defined between each of the pivot parts of the second protective swivel and the closed end of the second protective swivel.

3. The portable data storage device as claimed in claim 2, wherein a third distance defined between each of the inner pivot parts of the first protective swivel and the closed end of the first protective swivel is greater than a fourth distance defined between each of the pivot parts of the main housing and an end surface of the first electrical connector and is also greater than a fifth distance defined between each of the pivot parts of the main housing and an end surface of the second electrical connector.

4. The portable data storage device as claimed in claim 2, wherein the first electrical connector and the second electrical connector are different kinds of electrical connectors.

5. The portable data storage device as claimed in claim 1, wherein a third distance defined between each of the inner pivot parts of the first protective swivel and the closed end of the first protective swivel is greater than a fourth distance defined between each of the pivot parts of the main housing and an end surface of the first electrical connector and is also greater than a fifth distance defined between each of the pivot parts of the main housing and an end surface of the second electrical connector.

6. The portable data storage device as claimed in claim 5, wherein the first electrical connector and the second electrical connector are different kinds of electrical connectors.

7. The portable data storage device as claimed in claim 1, wherein the first electrical connector and the second electrical connector are different kinds of electrical connectors.

8. The portable data storage device as claimed in claim 1, wherein the first electrical connector and the second electrical connector are different kinds of electrical connectors.

* * * * *